United States Patent
Le Masson et al.

(10) Patent No.: US 6,503,636 B1
(45) Date of Patent: Jan. 7, 2003

(54) TRANSPARENT SUBSTRATE PROVIDED WITH A STACK OF LAYERS REFLECTING THERMAL RADIATION

(75) Inventors: Pascal Le Masson, Paris (FR); Alfred Hans, Roetgen (DE); Norbert Huhn, Herzogenrath (DE); Klaus Fischer, Alsdorf (DE); Marc Maurer, Verviers (BE)

(73) Assignee: Saint-Gobain Vitrage, Courbevoie (FR)

( * ) Notice: Subject to any disclaimer, the term of this patent is extended or adjusted under 35 U.S.C. 154(b) by 0 days.

(21) Appl. No.: 09/403,773
(22) PCT Filed: Mar. 2, 1999
(86) PCT No.: PCT/FR99/00466
§ 371 (c)(1), (2), (4) Date: Mar. 22, 1999
(87) PCT Pub. No.: WO99/45415
PCT Pub. Date: Sep. 10, 1999

(30) Foreign Application Priority Data

Mar. 3, 1998 (DE) .......................... 198 08 795

(51) Int. Cl.[7] .............................. B32B 9/00; C23C 14/06
(52) U.S. Cl. ....................... 428/472; 428/412; 428/480; 428/698; 428/699; 428/701; 204/192.1; 204/192.14; 204/192.26
(58) Field of Search .............................. 428/411.1, 480, 428/698, 699, 701, 412, 469, 472; 204/298.02, 192.1, 192.14, 192.26

(56) References Cited

U.S. PATENT DOCUMENTS 4,985,312 A 1/1991 Nakashima et al.
6,045,896 A * 4/2000 Boire et al. ................. 428/216

FOREIGN PATENT DOCUMENTS

| DE | 39 41 027 A | 7/1990 |
| DE | 44 22 830 A | 1/1995 |
| EP | 05 43 077 A1 | 4/1992 |
| EP | 0 698 585 A | 2/1996 |
| EP | 0 718 250 A | 6/1996 |
| EP | 0 747 330 A | 12/1996 |

OTHER PUBLICATIONS

Patent Abstracts of Japan, vol. 013, No. 512 (M–893, Nov. 16, 1989.

* cited by examiner

*Primary Examiner*—Deborah Jones
*Assistant Examiner*—Jennifer McNeil
(74) *Attorney, Agent, or Firm*—Oblon, Spivak, McClelland, Maier & Neustadt, P.C.

(57) ABSTRACT

A stack of layers reflecting heat radiation for transparent substrates comprises at least one silver functional layer and, on both faces of the latter, antireflection layers formed by one or more metal compounds. The antireflection layer under the silver layer comprises an upper partial layer of zinc oxide contiguous to the silver layer, and an additional partial layer, under the zinc oxide layer, which is formed by aluminum nitride and is under internal tensile stresses. With the aid of the AlN layer under tensile stresses, it is possible to compensate the internal compressive stresses existing in the ZnO layer.

30 Claims, No Drawings

TRANSPARENT SUBSTRATE PROVIDED WITH A STACK OF LAYERS REFLECTING THERMAL RADIATION

The invention relates to a stack of layers reflecting, at least in part, in the infrared range and reflecting, in particular, heat radiation, for transparent substrates, comprising at least one "functional" layer and "antireflection" layers which are arranged on both sides of the silver layer.

In the context of the invention, the term "functional layer(s)" is intended to mean the layer or layers which, in the stack, have the properties of reflection in the infrared range and/or in the solar radiation range, and which are generally metallic, more particularly based on a noble metal such as Ag (if appropriate also containing minority constituents, for example as small proportion of another metal). By way of explanation, silver layers have high reflectivity in the infrared range and their sunproofing or low-emission property can thus be utilized.

In the scope of the invention, the term "antireflection layers" is intended to mean a layer, or a superposed series of layers, having in particular the function of adjusting the optical appearance of the stack, with a view to reducing its light reflection, and generally based on dielectrics such as metal compounds, for example metal oxides.

The present invention thus concerns stacks of the (antireflection layer/functional layer/ antireflection layer) type, a sequence which may if appropriate be repeated n times, with n=1, 2, 3, . . . . It should be noted that thin layers, generally of metal, which are intended to protect and/or promote adhesion of the functional layers, may also be provided at the interfaces between the antireflection layers and the functional layers. These are sometimes referred to by the term "sacrificial layers" when they are on the functional layer and when they oxidize at least partially following the subsequent deposition of an oxide-based layer by reactive sputtering in the presence of oxygen.

The present invention relates, in particular, to a variant of this type of stack in which the antireflection layer arranged under the silver-based functional layer comprises an upper partial layer, formed by zinc oxide, immediately contiguous with the silver layer, and an additional partial layer arranged underneath.

A stack of layers of this type is known from document DE-39 41 027 A1. In this stack, the partial layer which is arranged under the zinc oxide layer which forms part of the "lower" antireflection layer consists of a metal oxide from the group formed by tin oxide, titanium dioxide, aluminum oxide, bizmuth oxide or a mixture of two or more of these oxides. The thickness of the zinc oxide layer cannot amount to more than 15 nm. This zinc oxide layer considerably improves the stability of the silver layer against corrosion. This is presumably attributable to the fact that the silver layer grows on the ZnO layer in a particularly regular and defect-free way.

Stacks with a plurality of layers comprising silver as the functional layer and a zinc oxide layer arranged immediately under the silver layer are also known from patents EP-0 464 789 B1 and EP-0 698 585 A1. In the stacks of layers disclosed by these publications, the lower antireflection layer consists either fully of zinc oxide, or of a plurality of alternating partial layers of ZnO and $SnO_2$.

The zinc oxide layers have, as lower layers for the silver layers, a highly advantageous effect on the silver layer and its properties. They have, however, the drawback that appreciable internal compressive stresses occur in the ZnO layers under conventional sputtering conditions. These internal compressive stresses in the ZnO layers can have an unfavorable effect on the stack of layers. As is explained in detail, in particular, in patent EP-0 464 789 B1, the zinc oxide layer can delaminate from the silver layer under the effect of the internal compressive stresses.

Stacks of layers including internal stresses are particularly unfavourable when they are applied to thin support films based on polymer(s), in particular of the organic variety, for example to poly(ethylene terephthalate) (PET) thin films. As a rule, these PET films have a thickness of the order of 30 to 50 $\mu$m. PET films coated in this way are being used increasingly, for example, to manufacture laminated windows having, in particular, heat reflection properties. The PET film is arranged sandwiched between two panes of glass of the silica-soda-lime type with the aid of two adhesive films based on thermoplastic polymer for example of polyvinyl butyral (PVB). It has been found that films such as PET which are coated with stacks of layers that comprise a ZnO layer under the silver layer roll up under the influence of the internal compressive stresses in the stack of layers, so that it becomes difficult to handle and process them.

The object of the invention is to develop a stack of layers of the kind described above, comprising in particular a ZnO layer immediately under the silver layer and, when they are deposited on polymer films of the PET type, not exhibiting the drawbacks mentioned above, that is to say do no tend to roll up once coated with the layers. In particular, this involves arranging for the internal stresses in the stack of layers to be lowered/reduced to a minimum or even fully eliminated.

The preferred system of layers according to the invention is defined in the following way: it is a stack of layers reflecting heat radiation for transparent substrates, comprising at least one functional layer formed by silver layer and which are formed by one or more metal compounds, the antireflection layer arranged under the silver layer comprising an upper partial layer formed by zinc oxide immediately contiguous to the silver layer, and an additional partial layer arranged underneath. This stack of layers is distinguished by the fact that the additional partial layer which is arranged under the zinc oxide layer and which belongs to the "lower" antireflection layer is a layer based on aluminum nitride which is under internal tensile stresses.

Preferably, the stack is such that the amplitude of the internal compressive stresses of the aluminum nitride layer corresponds, by adjustment of the coating parameters, approximately to the amplitude of the internal compressive stresses in the zinc oxide layer so that the tensile and compressive stresses of the two contiguous partial layers balance out at least for the most part.

Preferably, the stack is such that the zinc oxide layer has a thickness of less than 15 nm, and preferably less than 12 nm and advantageously at least 5 to 8 nm.

According to one embodiment of the stack according to the invention, it comprise two functional layers formed by silver, which are separated from one another by an additional antireflection layer, this additional antireflection layer also comprising two partial layers, namely one layer which is immediately contiguous to the upper silver layer, is formed by zinc oxide and is under internal compressive stresses, and a partial layer which is contiguous to the lower silver layer, is formed by aluminum nitride and is under internal tensile stresses.

One example of a stack according to the invention is characterized by the following structure:

Substrate/AlN/ZnO/Ag/Ti/$TiO_2$

Another example is characterized by the following structure:

Substrate/AlN/ZnO/Ag/AlN
or by the following structure:
Substrate/AlN/ZnO/Ag/AlN/ZnO/Ag/AlN The invention also relates to the use of such a stack of layers for coating films of thin polymer, in particular PET, in particular so that the coating parameters of the AlN-based layers formed by reactive sputtering from a metallic aluminum cathode are chosen such that the coated film does not, after the formation of the stack, have any substantial curvature induced by stresses internal to the stack.

The invention makes advantage of the fact that during the sputtering of the AlN layers, it is possible, by choosing the parameters of the sputtering conditions, for example by modifying the $Ar:N_2$ ratio in the working gas, to modify within wide limits the internal mechanical stresses in the AlN layer. For example, it is disclosed by the article "Stress tuning in AlN thin films", Z. Vakuum in der Praxis (1991) No. 2—pages 142–147 that, depending on the $Ar:N_2$ ratio, which was modified in the range of from 1:3 to 3:1, both relatively high internal compressive stresses and relatively high internal tensile stresses can be obtained without significant differences in the Ar:N ratio being observable in the AlN layer itself. The internal stresses are instead explained solely by the microstructure of the AlN layer, internal tensile stresses being generated in the layer when sputtering conditions are chosen leading to a low stacking density of the AlN crystals.

The optimum conditions for manufacturing the sequence of layers according to the invention can be determined empirically by trials in each particular case. For example, an AlN layer and a ZnO layer which have the desired layer thicknesses may successively be deposited by sputtering (preferably magnetic-field assisted) on thin substrate, for example thin PET films. Depending on the sign of the resultant internal stress in this sequence of layers, the coated film will curve and roll up in one or other direction. The sputtering conditions for the AlN layer are then intentionally modified on the basis of the observed result until the PET sheet no longer exhibits significant deformations after formation of the coating. The sputtering conditions found in this way are then used as parameters for forming the stack under manufacturing conditions.

The structure of layers according to the invention can be advantageous and find its application for all substrate. It is, however, of particular advantage for the coating of thin polymer films because it is possible in this way to prevent the coated films from rolling up, so that they are easier to handle when putting the invention into practice. The PET films often have thermally stabilized intrinsic stresses which are imparted to them by the manufacturing process. It is likewise possible for the internal stresses originally present to be modified, or for new internal stresses to be induced, during the sputtering operation, under the effect of temperature and/or plastic deformation of the films. It is clear in these cases that, when the optimum sputtering conditions are being determined for the AlN layer, these inherent stresses of the film should also be taken into account so that it is not the stack itself which is free of resultant internal stresses, but the coated film as a whole.

More generally, the invention may also be defined in the following way: the invention also relates to a transparent substrate, quite particularly in the form of a flexible polymer film such as PET, provided with a thin-film stack including at least one metallic functional layer with reflection properties in the infrared range, such as Ag, arranged between two dielectric-based antireflection layers, here intended to be taken as meaning the "functional" layer and "antireflection" layer as specified above. The "lower" antireflection layer, arranged between the functional layer and the substrate, is either a monolayer based on modified AlN whose stress level is balanced (relaxed), or is a superposed sequence of layers comprising at least one AlN layer on top of which there is a metal oxide layer whose stress levels mutually compensate/cancel at least in part.

The variant described above is thus found, namely an antireflection layer of the AlN/ZnO type in which the tensile stress level of the AlN layer will compensate broadly, if not completely, for the compressive stress level in the ZnO layer. A variant is also provided in which the antireflection layer comprises only AlN, and in which this time this layer should be substantially free of stresses of any kind, in order to achieve the same result as in the two-layer variant. The "two-layer" variant has the advantage of retaining the oxide layer such as ZnO which is known to be favourable for good wetting of the silver layer, the "monolayer" variant having for its part the advantage of a stack which is simpler, takes less time to manufacture and has fewer layers.

The AlN-based layer used in the lower antireflection layer may, in particular, comprise another minority metal, in particular zinc, for example in a proportion of from 0.1 to 10 atomic % relative to aluminum.

Preferably, the ozide layer such as ZnO of the lower antireflection layer is contiguous with the functional layer. Provision may also be made to interpose, between them, a thin metallic layer, such as titanium, nickel alloy like NiCr, niobium, etc. The stack may contain a single functional layer or n functional layers with $n \geq 2$. In this configuration "intermediate" antireflection layers should be provided between the two functional layers where n=2, or between two successive functional layers when n>2.

This "intermediate" antireflection layer, or at least one of them, may include, like the "lower" antireflection layer, a nonolayer based on AlN modified so that its stress level is balanced (replaced), or a superposed sequence of layers comprising at least on AlN-based layer on top of which there is a metal oxide layer such as ZnO whose stress levels mutually compensate/cancel at least in part.

Advantageously, the functional layer (or at least one of them if there are more of them) has a thin sacrificial metallic layer on top of it, such as Nb, Ti or NiCr, which is in particular important if deposition is being carried out above dielectric layers made of oxide by sputtering under oxidizing conditions.

Advantageously, the "intermediate" and/or "upper" antireflection layers ("upper" corresponds to the layers which "end" the stack) contain layers based on metal oxide selected from at least one of the following oxides: $SnO_2$, $Ta_2O_5$, $TiO_2$, $Nb_2O_5$, $ZrO_2$, $TiO_2$ and/or layers based on nitrites such as AlN and $Si_3N_4$.

The invention also applies to multi-layer lower antireflection coatings in which the ZnO is replaced by another oxide having a given stress level (tensile or compressive) which the combination with the AlN-based layer will make it possible to balance, and compensate to a large extent ($SiO_2$, $WO_3$, etc.).

The invention can be applied to any rigid transparent substrate such as glass, certain polycarbonates such as PMMA (polymethyl methacrylate) or, more specifically, to substrates in the form of films of flexible polymer such as PET, certain polyesters, etc. The invention makes it possible for the flexible polymer film of this type to be essentially free of any "involuntary" radius of curvature after the layers have been deposited.

The invention also relates to the use of the coated film for manufacturing sunproof or low-emission functional laminated windows, and to the laminated windows thus obtained.

The invention also relates to the process for manufacturing the coating on the substrate of the flexible polymer type, by sputtering, the concept of the invention being to vary the parameters for depositing, by reactive sputtering, the constituent layer(s) of the lower antireflection layer, at least, so as to minimize or cancel its overall stress level in order to induce substantially no curvature in the film due to the internal stresses. In order to do this, two parameters in particular may be adjusted in a suitable way, namely the total pressure in the atmosphere in which the deposit(s) is/are made, and the ratio between the amount of inert gas (Ar) and reactive gas ($O_2$ or $N_2$) in the reactive atmosphere.

Examples of stacks of layers according to the invention deposited on PET polymer films are described in more detail below.

EXAMPLE 1

A layer stack reflecting heat radiation, comprising the successive sequence of layers:

substrate/AlN/ZnO/Ag/Ti/$TiO_2$ is to be applied to a 50 $\mu$m thick PET film from the Hoechst company using the process of magnetic field-assisted reactive sputtering.

In order to determine the optimum sputtering conditions for the lower antireflection layer formed by the two AlN/ZnO partial layers. PET film specimens with 30×30 cm dimensions are firstly coated in succession with two partial layers of 30 nm AlN and 10 nm ZnO in a laboratory sputtering system from the Leybold company. The sputtering is carried out by the DC plane sputtering process. After the coating was formed, the deformation of the film was assessed by adopting measurement of the radius of curvature which the film assumes after formation of the coating as the way of quantitatively assessing the internal stresses of the coated film. The layer structure is deemed good when the coated film no longer curves after having been removed from the coating system, but retains its flat shape.

After several trials, it is found that the optimum coating conditions are achieved when the AlN layer is applied by reactive sputtering of a pure aluminum target in an argon/nitrogen working gas mixture having an Ar:$N_2$ ratio of 2.5:1, while the ZnO layer is formed by reactive sputtering of a metallic zinc target in a mixture of argon and oxygen gases having an Ar:$O_2$ ratio of 1:1. Under these conditions, the film specimens coated with this double layer do not suffer any deformation, that is to say the internal stresses in the various layers of the coated film cancel by addition.

After the sputtering conditions had been determined in this way for the lower antireflection layer, a system of several layers having the following layer structure and the layer thicknesses below was applied in the same coating system to a 50 $\mu$m thick PET film, the layer thicknesses being indicated in nm:

substrate-30 AlN-10 Ag-1 Ti-30 $TiO_2$

The Al target was again sputtered in an Ar:$N_2$ atmosphere having an Ar:$N_2$ ratio of 2.25:1 using the DC plane sputtering process, and the Zn target was sputtered in an Ar:$O_2$ atmosphere having an Ar:$O_2$ ratio of 1:1, also using the DC plane sputtering process. The following layers were also deposited by the DC plane sputtering process, the working gas for the Ag and Ti sputtering being formed by pure argon, and the working gas for the reactive sputtering of the $TiO_2$ layer consisting of an Ar:$O_2$ mixture having an Ar:$O_2$ ratio of 1.4:1.

Using the coated film, a laminated window was manufactured by using two polyvinyl butyral sheets with a thickness of 0.38 mm to assemble the coated PET sheet with two sheets of float glass, each with a thickness of 2.1 mm, using heat and pressurization, in the known way. Even after the conversion into a laminated window, the coated PET sheet does not exhibit any defect such as tears or surface deformations, and the laminated window has moreover an excellent appearance.

The optical properties which were determined using a conventional measuring process correspond to requirements in terms of optical transmission, optical reflection and colour neutrality.

The tests carried out to determine the corrosion resistance of the stack of layers, namely the humidity test according to ANSI standard Z 26.1, test No. 3 as well as the salt spray test according to DIN standard 50021 also give good results.

EXAMPLE 2

A stack of a plurality of layers having the following layer structure was deposited on a PET film having a thickness of 50 $\mu$m, the thickness of the various layers being again indicated in nm:

substrate-30 AlN-10 ZnO-10 Ag-82 AlN-10 ZnO-10 Ag-40 AlN The sputtering conditions for the various layers, as regards the working gases and the sputtering processes applied, correspond to the conditions indicated in Example 1. The application of a thin sacrificial metallic layer to each of the two silver layers is not necessary because the working gas for each of the following AlN layers is entirely free of oxygen.

In order to evaluate the usefulness and the properties of the stack of layers in laminated glass, the coated film was again assembled with two polyvinyl butyral sheets, each 0.38 mm thick, and two sheets of float glass, each with a thickness of 2.1 mm, by applying sufficient heat and pressure. Tests were carried out on the laminated window achieved.

Judging by the optical condition of the window, this stack of layers has very good appearance in the laminated window, that is to say no tear or deformation can be seen in the coated film.

The optical properties of the coated window, which were determined using a conventional measuring process, correspond in terms of optical transmission and optical reflection ion the visible spectrum range., total energy transmission and shade neutrality, to the requirements in force for using the laminated window as a windscreen of a motor vehicle.

The following tests were carried out in order to evaluate the corrosion resistance of the stack of layers in the laminated window:

humidity test according to ANSI standard Z 26.1 (test No. 3): according to this test, the specimen is exposed over a period 14 days to a temperature of 40 ° C. in an atmosphere with 100% relative humidity. No trace of corrosion or delamination was observed.

According to the salt spray test corresponding to DIN standard 50021, the specimens were exposed for 10 days to the spray mist. Some small traces of corrosion were observed in the contour of the specimens, but no delamination.

What is claimed is:

1. A transparent film comprising a flexible polymer film, provided thereon with a thin-film stack comprising at least one metallic functional layer with reflection properties in the infrared range, arranged between two dielectric-based antireflection layers, wherein the lower of said two antireflection layers is arranged between the functional layer and the flexible polymer film, and which lower antireflection layer (1) is a monolayer based on a modified AlN whose stress level is balanced, or (2) is a superposed sequence of layers comprising at least one AlN-based layer on top of which there is a metal oxide-based layer whose stress levels mutually compensate or cancel at least in part, wherein the transparent film does not have any substantial curvature induced by stresses internal to the stack.

2. The transparent film according to claim 1, wherein the metallic functional layer comprises Ag.

3. The transparent film according to claim 2, wherein the lower antireflection layer comprises monolayer (1) which also includes a least one other metal in a minor amount.

4. The transparent film according to claim 3, wherein the other metal is zinc.

5. The transparent film according to claim 4, where the zinc is present in a proportion of from 0.1 to 10 atomic % relative to aluminum.

6. The transparent film according to claim 2, wherein lower antireflection layer is a superposed sequence of layers (2) which comprises an AlN-based layer/zinc oxide-based layer sequence, the AlN-based layer having a tensile stress level, and the zinc oxide-based layer having a compressive stress level.

7. The transparent film according to claim 6, wherein the zinc oxide-based layer has a thickness of less than 15 nm.

8. The transparent film according to claim 7, wherein the thickness is less than 12 nm.

9. The transparent film according to claim 6, wherein the amplitude of the internal compressive stresses of the AlN-based layer corresponds, by adjustment of the coating parameters, approximately to the amplitude of the internal compressive stresses in the zinc oxide-based layer so that the tensile and compressive stresses of the two contiguous partial layers balance out at least for the most part.

10. The transparent film according to claim 2, wherein the lower antireflection layer is a superposed sequence of layers (2) and is contiguous with the functional layer, and the metal oxide layer comprises zinc oxide.

11. The transparent film according to claim 10 and having the following structure: polymer film/AlN/ZnO/Ag/AlN.

12. The transparent film according to claim 2, wherein a thin metallic layer is arranged between the lower antireflection layer and the functional layer.

13. The transparent film according to claim 12, wherein the thin metallic layer comprises titanium or a nickel alloy, or niobium.

14. The transparent film according to claim 13, wherein the nickel alloy is an NiCr alloy.

15. The transparent film substrate according to claim 2, wherein the functional layer has a thin sacrificial metallic layer on top of it.

16. The transparent film according to claim 15, wherein the thin sacrificial metallic layer comprises Nb, Ti or NiCr.

17. The transparent film according to claim 16 and having the following structure: polymer film/AlN/ZnO/Ag/Ti/TiO$_2$.

18. The transparent film according to claim 1, wherein the stack comprises at least two functional layers with an intermediate antireflection layer between the two functional layers or between two successive functional layers.

19. The transparent film according to claim 18, wherein the functional layers comprise Ag.

20. The transparent film according to claim 19, wherein the intermediate antireflection layer, or at lest one of them, includes a monolayer based on AlN modified so that its stress level is balanced, or is a superposed sequence of layers comprising at least one AlN-based layer on top of which there is a metal oxide-based layer whose stress levels mutually compensate or cancel at least in part.

21. The transparent film according to claim 20, wherein the metal oxide layer comprises zinc oxide.

22. The transparent film according to claim 19, wherein at least one of the functional layers has a thin sacrificial metal layer on top of it.

23. The transparent film according to claim 22, wherein the thin sacrificial metallic layer comprises Nb, Ti or NiCr.

24. The transparent film according to claim 19, wherein the intermediate and/or upper of said two antireflection layers contain layers based on metal oxide is selected from the group consisting of SnO$_2$, Ta$_2$O$_5$, Nb$_2$O$_5$, ZnO, and TiO$_2$ or layers based on nitrides selected from the group consisting of AlN and Si$_3$N$_4$.

25. The transparent film according to claim 19, wherein it comprises two functional silver layers, which are separated from one another by said antireflection layer, wherein the antireflection layer comprises two partial layers (a) and (b), wherein (a) is immediately contiguous to the upper silver layer, is formed of zinc oxide and is under internal compressive stresses, and (b) is contiguous to the lower silver layer, is formed of aluminum nitride and is under internal tensile stresses.

26. The transparent film according to claim 19 and having the following structure: polymer film/AlN/ZnO/Ag/AlN/ZnO/Ag/AlN.

27. The transparent film according to claim 1, wherein the flexible polymer film comprises PET, and the transparent film is essentially free of any unintentional radius of curvature.

28. A laminated window, which incorporates the transparent film according to claim 27.

29. The laminated window according to claim 28, wherein said transparent film is sandwiched between two PVB sheets, which are sandwiched between two glass substrates.

30. Process for preparing the transparent film according to claim 1, comprising forming the AlN-based layers by reactive sputtering form a metallic aluminum cathode, and selecting inert gas and reactive N$_2$ gas to be in an appropriate ratio in the atmosphere of said reactive sputtering such that the transparent film does not have any substantial curvature induced by internal stresses after the formation of the stack.

* * * * *

UNITED STATES PATENT AND TRADEMARK OFFICE
CERTIFICATE OF CORRECTION

PATENT NO.    : 6,503,636 B1
DATED         : January 7, 2003
INVENTOR(S)   : Le Masson et al.

It is certified that error appears in the above-identified patent and that said Letters Patent is hereby corrected as shown below:

<u>Title page,</u>
Item [86], should read:

-- [86]  PCT No.:         PCT/FR99/00466

§ 371 (c)(1),
         (2), (4) Date:   Mar. 22, 2000 --

Signed and Sealed this

Twentieth Day of May, 2003

JAMES E. ROGAN
*Director of the United States Patent and Trademark Office*